United States Patent [19]
Davies

[11] Patent Number: 6,108,257
[45] Date of Patent: Aug. 22, 2000

[54] ZERO POWER SRAM PRECHARGE

[75] Inventor: Thomas J. Davies, Albuquerque, N. Mex.

[73] Assignee: Philips Electronics North America Corporation, New York, N.Y.

[21] Appl. No.: 09/408,791

[22] Filed: Sep. 30, 1999

[51] Int. Cl.[7] .................................................. G11C 7/12
[52] U.S. Cl. ...................... 365/203; 365/202; 365/190; 365/227
[58] Field of Search .................................... 365/203, 190, 365/202, 227, 226

[56] References Cited

U.S. PATENT DOCUMENTS 5,453,951  9/1995  Proebsting ........................... 365/181
5,546,338  8/1996  Proebsting ........................... 365/181

Primary Examiner—Andrew Q. Tran
Attorney, Agent, or Firm—Brian J. Wieghaus

[57] ABSTRACT

A precharge circuit is provided that produces a reference voltage that can be used for the precharge process, without a direct current flow from the supply voltage. In a preferred embodiment of this invention, the precharge circuit precharges one bus to the supply voltage, and the other bus to ground potential, then, while each bus is capacitively charged to each of the supply and ground potentials, the buses are connected together. Assuming substantially equal capacitance on each bus, the resultant voltage on each bus will be half the supply voltage. A charge transfer effects the precharging of the buses to the supply and ground potential; the only current drawn from the power source is the transient current associated with a switch of capacitive loads.

14 Claims, 4 Drawing Sheets

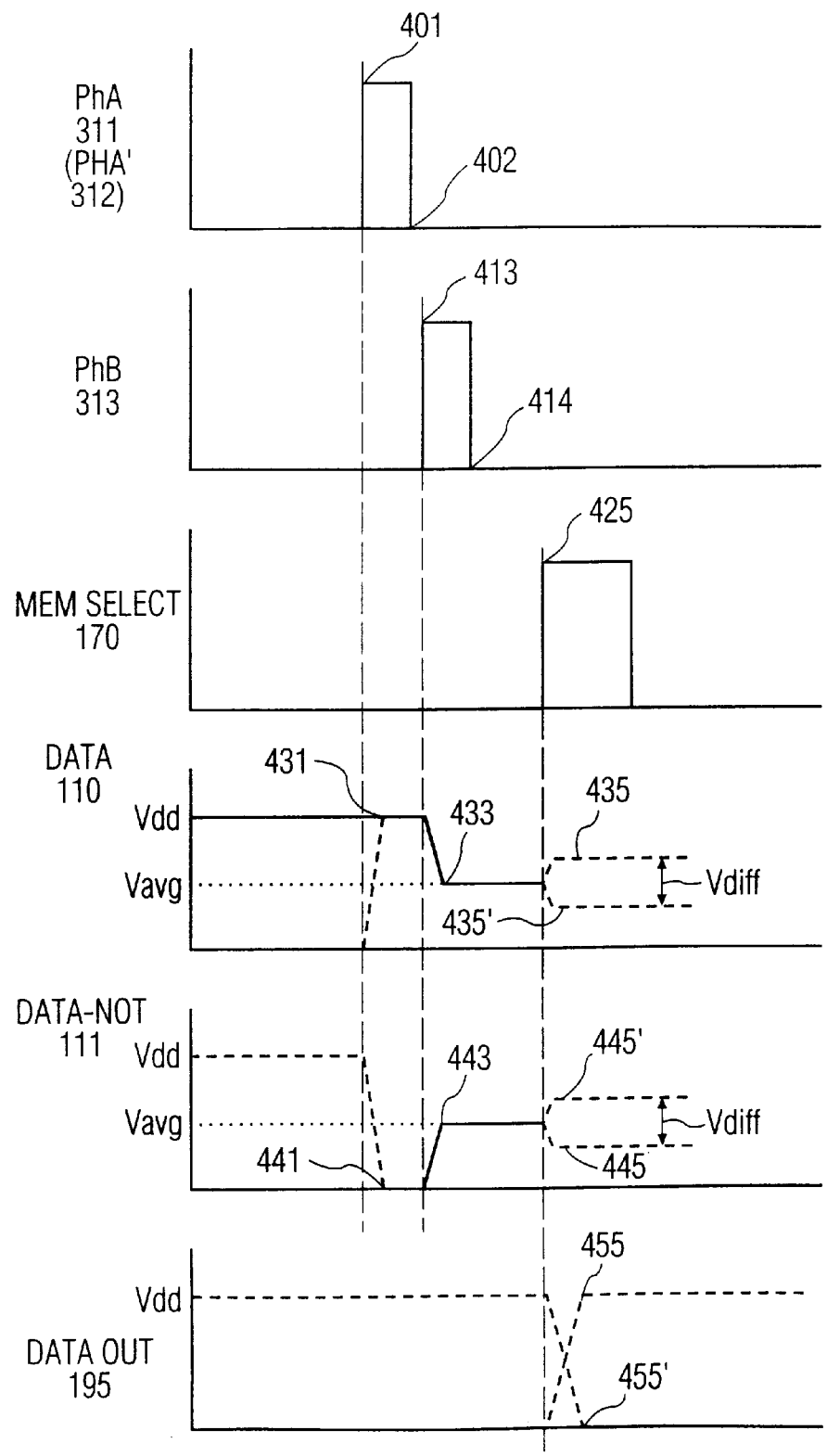

ZERO POWER SRAM PRECHARGE

BACKGROUND OF THE INVENTION

1. Field of the Invention

This invention relates to the field of electronic devices, and in particular to memory devices.

2. Description of Related Art

Memory devices are commonly designed to be as small as possible, so as to maximize the storage density. Typically, as illustrated in FIG. 1, each memory element, or cell 180, comprises a pair of cross-coupled inverters 181, 182. The output of each inverter 181, 182 is connected to the input of the other inverter 182, 181, and connected to a bus 111, 110, to which other memory elements are also connected. Conventional selection means 170, such as "row" and "column" selection, connect the selected memory element 180 to the buses 110, 111. The output of one 182 of the inverters is connected to a "data" bus 110, and the output of the other inverter 181 is connected to a "data-not", or "data-bar", bus 111, each logic output value being opposite the other, due to this cross-coupling.

Typically, for maximum circuit density, the inverters 182, 181 are minimally sized, and are not able to provide sufficient power to bring the respective data 110 and data-not 111 buses to a true logic-zero or logic-one state. That is, they are insufficiently sized to sink or source the charge on the bus so that one of the busses is brought to a ground potential, and one of the busses is brought to the power supply potential, typically termed Vdd. Thus, a differential detector 190 is typically provided to sense a difference between the voltages on the data 110 and data-not 111 busses, and produces the appropriate logic output value 195 corresponding to the state of the memory element 180.

To properly detect the voltage differential presented at the data 110 and data-not 111 buses, the data 110 and data-not 111 buses are "precharged" to a known voltage before the particular memory cell 180 is connected to the buses. The known voltage is typically selected to be a voltage that is not sufficiently high, nor sufficiently low, to cause either inverter 181, 182 in the memory cell 180 to change state. FIG. 1 illustrates an example precharge circuit 100 that is commonly used to precharge the data 110 and data-not 111 lines to a voltage level that is approximately equal to half the supply voltage Vdd 101. FIG. 2 illustrates an example timing diagram corresponding to the operation of the circuit that is illustrated in FIG. 1.

The precharge circuit 100 comprises a pair of inverters 121, 122. The inverter 121 is formed by transistors P1 and N1, and has an input 130 and output 140. The inverter 122 is formed by transistors P2 and N2, and has an input 140 and an output 130. Thus, this inverter pair 121, 122 is similar in structure to the inverter pair 181, 182 a conventional memory cell 180. As contrast to a conventional memory cell 180, a switch transistor X3 is provided that, when enabled by signal PhA 150, illustrated by the pulse 201 on Line 2A of FIG. 2, connects the inputs and the outputs 130, 140 of the cross-coupled inverters 121, 122 together. When the inputs and outputs 130, 140 are connected, both inverters 121, 122 enter the active state, such that all four transistors P1, N1, P2, N2 are conducting. With all of the transistors P1, N1, P2, N2 conducting, the voltage at node 130 will go to the threshold voltage of the inverters, which is substantially equal to half the supply voltage Vdd, as illustrated at 231 on line 2D of FIG. 2. That is, the supply voltage Vdd is divided between the voltage drop across the p-channel transistors P1, P2, and the voltage drop across the n-channel transistors N1, N2, respectively.

In typical operation, after control signal PhA 150 is asserted to bring nodes 130 and 140 to half the supply voltage Vdd 101, the control signal PhB 160 is asserted, at 211 of Line 2B of FIG. 2. Signal PhB 160 controls switch transistors X1 and X2. When control signal PhB 160 is asserted, the voltage at node 130 is placed on both the data 110 and the data-not 111 buses, as illustrated at 241 of Line 2E of FIG. 2. Thereafter, the control signals PhA 150 and PhB 160 are de-asserted, at 202 and 212 of Lines 2A and 2B of FIG. 2, respectively. The capacitance associated with the buses 110 and 111 maintain each bus at the transferred voltage from node 130 (nominally Vdd/2). That is, the buses 110, 111 are precharged to the nominal voltage level of Vdd/2.

Having precharged each bus 110, 111 to the same voltage level, the particular memory cell, cell 180 in this example, is selected for a "read" of the value contained within the memory cell 180, as illustrated at 225 of Line 2C of FIG. 2. Because the memory cell 180 contains opposing inverters 181, 182, the voltage level on one of the buses 110, 111 increases while the voltage at the other bus 111, 110 decreases, depending upon the logic value stored in the cell 180, as determined by the state of the cross-coupled inverters 181, 182, and as illustrated at 245 of Line 2E of FIG. 2. This difference in voltage levels on the data 110 and data-not 111 buses is detected by the differential amplifier 190, and an appropriate logic-0 or logic-1 value is produced by the differential amplifier 190, corresponding to the logic state of the selected memory device 180, as illustrated at 255 of Line 2G of FIG. 2.

Note that, to produce the nominal reference voltage Vdd/2 for transfer to the data 110 and data-not 111 buses, at 231 of FIG. 2, the four transistors P1, N1, P2, N2 are placed in a conductive mode. During this conductive mode, current flows through the transistors P1, N1, P2, N2 from the voltage source Vdd 101. This current flow minimizes the effective utilization period for portable and hand-held computer devices, because this current is typically drawn from a battery source, with limited energy providing potential.

BRIEF SUMMARY OF THE INVENTION

It is an object of this invention to provide a precharge circuit that minimizes the energy required to effect the precharge. It is a further object of this invention to provide a precharge circuit that utilizes fewer components than a conventional reference voltage generator.

These objects and others are achieved by providing a precharge circuit that produces a reference voltage that can be used for precharging each bus, without a direct current flow from the supply voltage. In a preferred embodiment of this invention, the precharge process precharges one bus to the supply voltage, and the other bus to ground potential, then, while each bus is capacitively charged to the supply and ground potentials, the buses are connected together. Assuming substantially equal capacitance on each bus, the resultant voltage on each bus will be half the supply voltage. A charge transfer effects the precharging of the buses to the supply and ground potentials; the only current drawn from the power source is the transient current associated with a switch of capacitive loads.

BRIEF DESCRIPTION OF THE DRAWINGS

The invention is explained in further detail, and by way of example, with reference to the accompanying drawings wherein:

FIGS. 4A through 4F illustrate an example timing diagram of a memory and precharge device in accordance with this invention.

Throughout the drawings, same reference numerals indicate similar or corresponding features or functions.

DETAILED DESCRIPTION OF THE INVENTION

Figure 3:
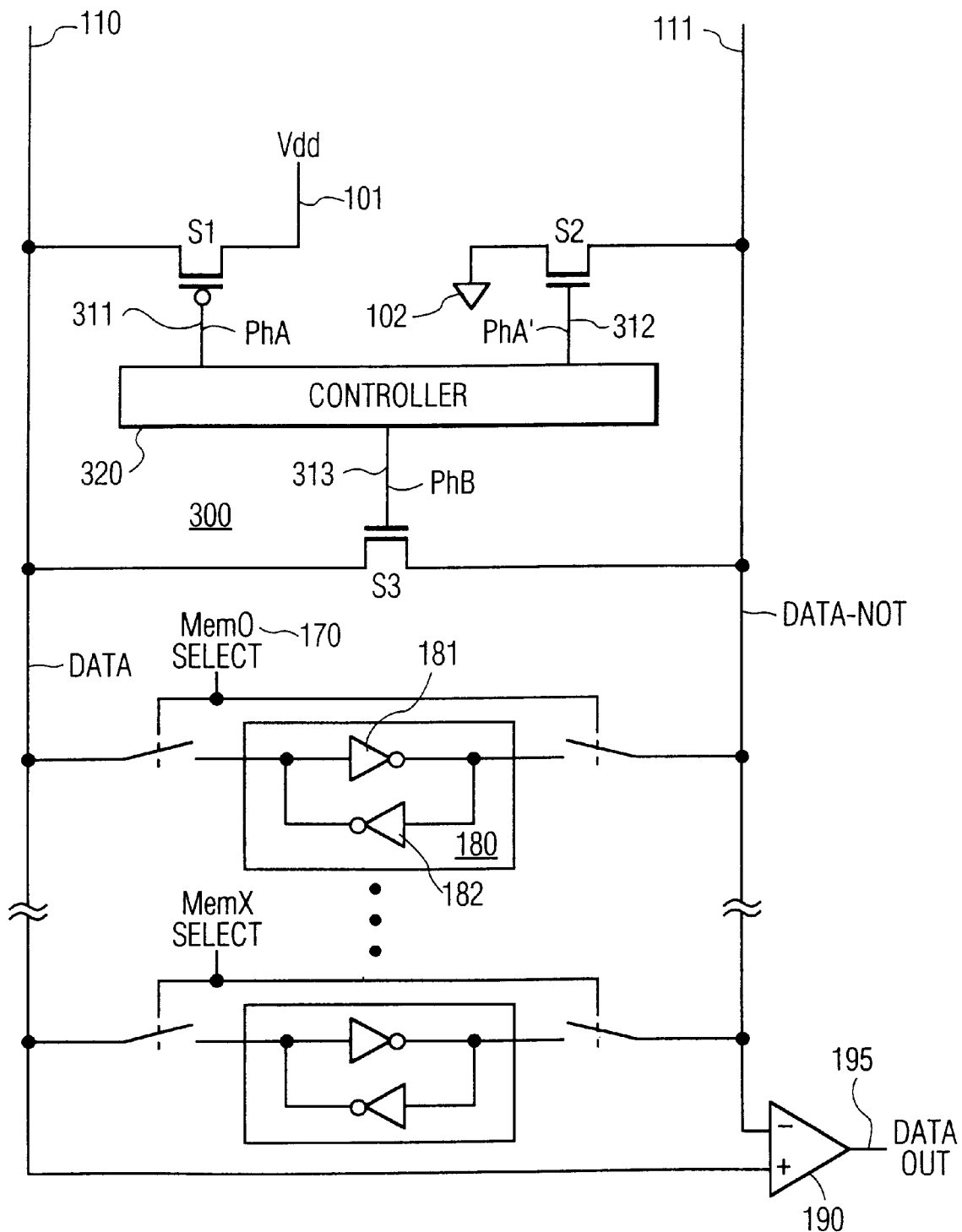
FIG. 3 illustrates an example precharge device in accordance with this invention.

FIG. 3 illustrates an example precharge device 300 in accordance with this invention. The precharge device 300 includes three switch devices S1, S2, and S3, and a controller 320. FIG. 4 illustrates an example timing diagram corresponding to the example precharge device 300.

As illustrated at 401 of Line 4A of FIG. 4, the controller 320 asserts signals PhA 311 and PhA' 312 to precharge the data bus 110 and the data-not bus 111 to differing reference voltages, via switches S1 and S2, respectively. In the example device 300 of FIG. 3, the data bus 110 is precharged to Vdd 101, and the data-not bus 111 is precharged to ground potential 102, as illustrated at 431 and 441 of Lines 4D and 4E of FIG. 4, respectively. As will be evident to one of ordinary skill in the art, either bus 110, 111 may be precharged to Vdd 101, the other to ground 102, or other suitable, and differing, reference voltages. At 402 of Line 4A of FIG. 4, the controller 320 de-asserts signals PhA 311 and PhA' 312, thereby opening switches S1 and S2. The capacitance associated with each bus 110, 111 causes each bus 110, 111 to maintain each potential, Vdd 101 and ground 102, respectively.

At 413 of Line 4B of FIG. 4, the controller 320 asserts signal PhB 313, thereby closing switch S3. When switch S3 is closed, the charge on bus 110 and the charge on bus 111 merge, and the voltage on each bus 110, 111 approach a common average voltage value, Vavg, as illustrated at 433, 443 on Lines 4D, 4E of FIG. 4. The common average value Vavg is a function of the capacitance of each bus 110, 111, and the initial voltage of each bus. Assuming substantially equal capacitances, if one bus 110, 111 is at a voltage potential of Vdd, and the other bus 111, 111 is at a ground potential of zero volts, the common voltage value of each bus 110, 111 is substantially equal to the average of the bus potentials, (Vdd+0)/2. If other reference voltages are present on the buses 110, 111, the common voltage value of each bus 110, 111 is substantially equal to the average of these other reference voltages.

The controller 320 de-asserts signal PhB 313 to reopen switch S3, thereby decoupling the buses 110, 111, at 414 of FIG. 4. At 425 of FIG. 4, the memory select signal 170 selects a memory cell 180 of FIG. 3. Depending upon the state of the memory cell 180, the voltage level on the bus 110 will either increase 435, or decrease 435', while the voltage level on the bus 111 will correspondingly decrease 445 or increase 445', as illustrated on Lines 4D and 4E of FIG. 4, respectively. The difference detector 190 detects this voltage difference Vdiff, and provides a corresponding high 455 or low 455' logic level to other devices that utilize the result of the memory read operation.

Figure 1:
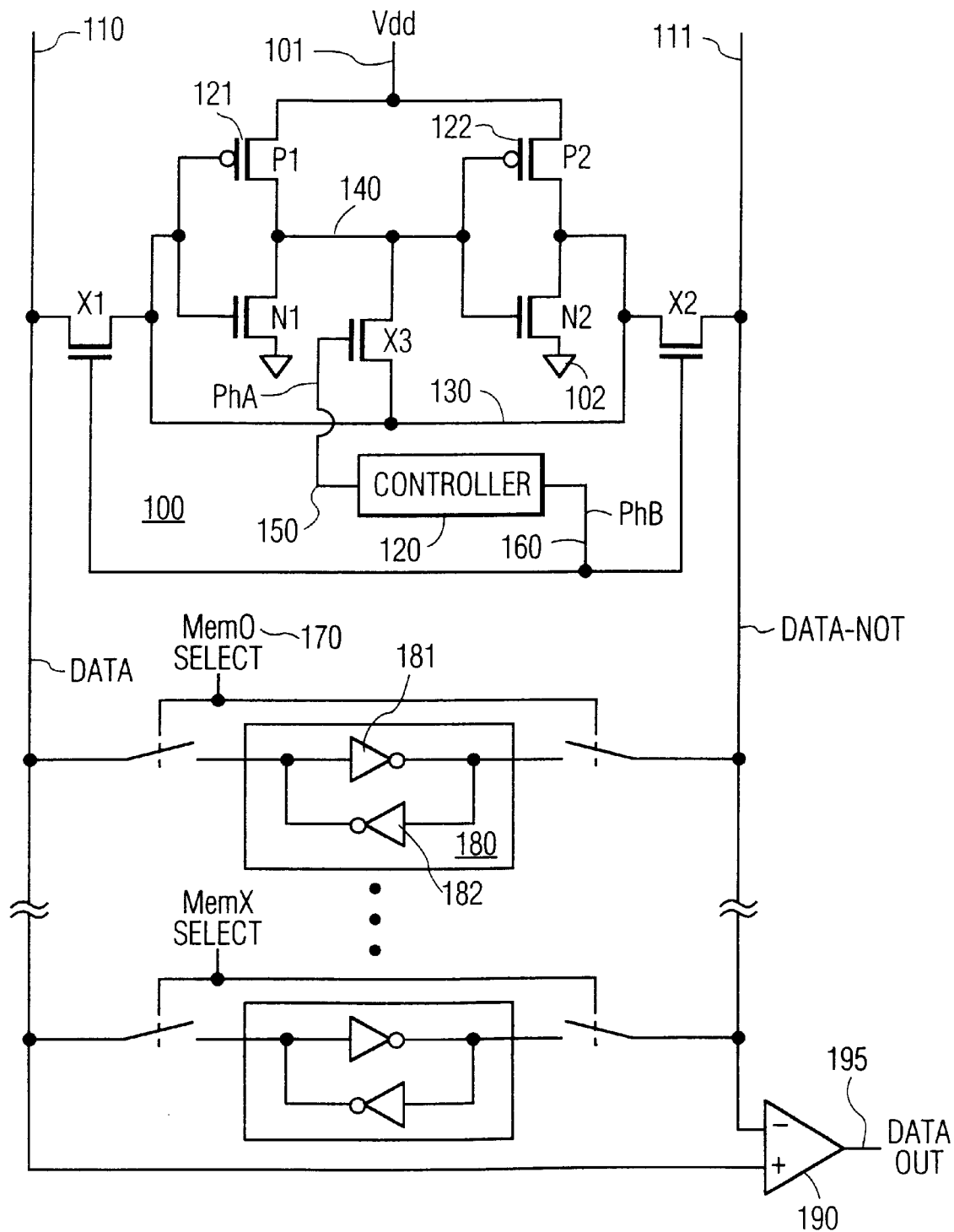
FIG. 1 illustrates an example prior art memory and precharge device.
Figure 2:
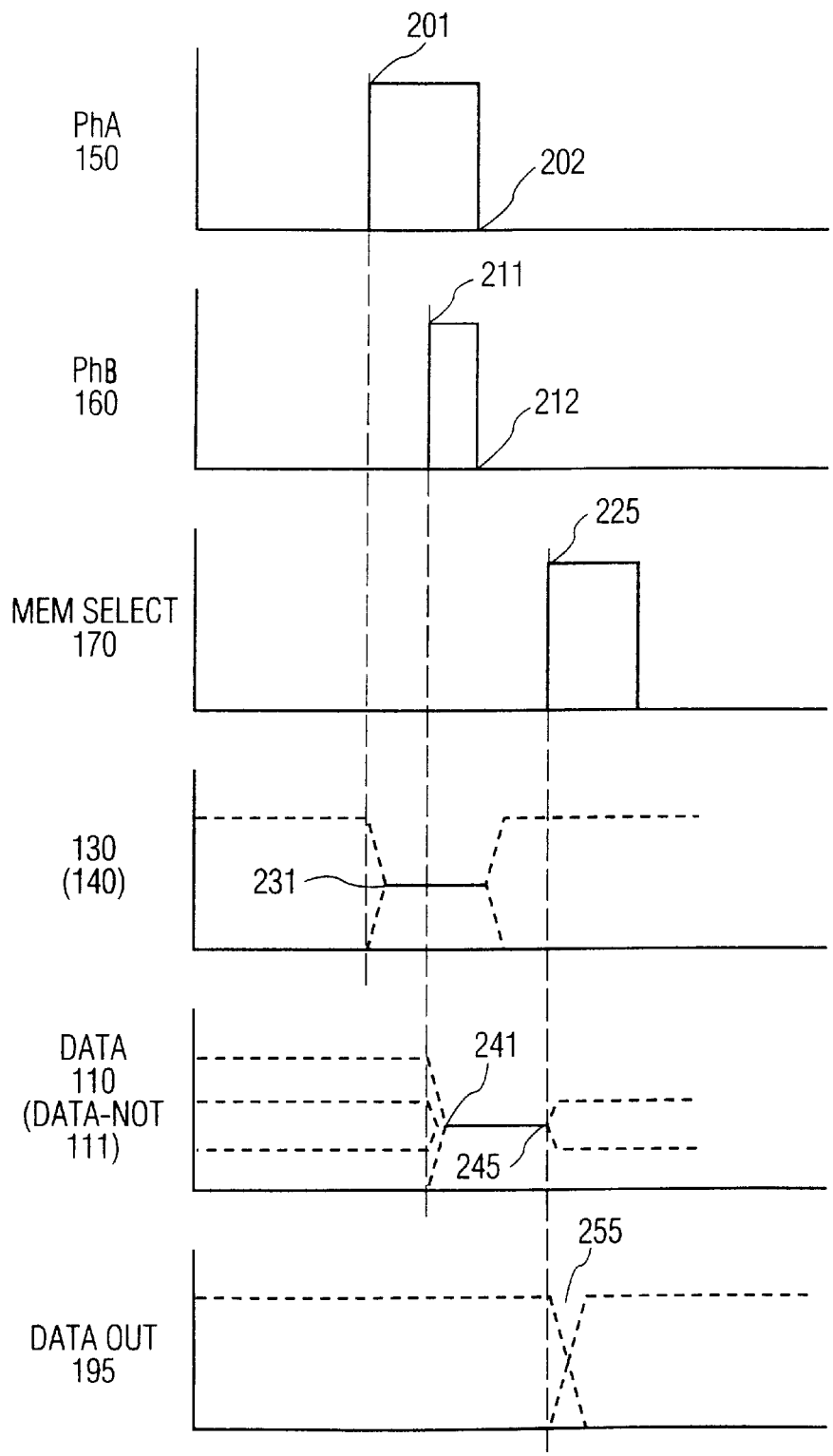
FIGS. 2A through 2F illustrate an example timing diagram of a prior art memory and precharge device.

It is significant to note that, in a preferred embodiment of the invention, the controller 320 controls the switches S1, S2, and S3, as discussed above, so that a current does not flow at any point in time directly between the reference voltages Vdd and ground. The current is limited to a capacitive charging or discharging of the buses 110 and 111 to the fixed reference voltages Vdd and ground, similar to that used for conventional CMOS devices. Note, also, that an independent reference voltage source, such as the cross-coupled inverters 121, 122 of FIG. 1, is not required, and the precharge circuit 300 uses only the commonly available reference voltages Vdd 101 and ground 102.

The foregoing merely illustrates the principles of the invention. It will thus be appreciated that those skilled in the art will be able to devise various arrangements which, although not explicitly described or shown herein, embody the principles of the invention and are thus within its spirit and scope. For example, although the switches S1, S2, and S3 are illustrated as N and P channel transistors, other technologies may also be utilized. Alternative configurations may also be employed. For example, the switches S1 and S2 may be complementary devices that can each be configured to either Vdd or ground, and the controller 320 determines which bus is brought to Vdd based upon a prior state of the buses 110, 111. That is, for example, if a write operation to the buses results in the data-not bus 111 being at Vdd, the controller 320 configures the complementary switches S1 and S2 so that the data bus 110 is connected to ground 102, while the data-not bus 111 is connected to Vdd 101. Conversely, if a prior operation leaves the data-not bus at ground potential 101, the controller 320 configures the switches in the opposite configuration. In this manner, the power required for precharging the buses 110 and 111, is further reduced. These and other system configuration and optimization features will be evident to one of ordinary skill in the art in view of this disclosure, and are included within the scope of the following claims.

I claim:

1. A precharge device for precharging a data bus and a data-not bus to a common precharge voltage, the precharge device comprising:

a first switch that couples the data bus to a first reference voltage, a second switch that couples the data-not bus to a second reference voltage that is different from the first reference voltage, a third switch that couples the data bus and the data-not bus to produce the common precharge voltage on the data bus and the data-not bus that is a composite of the first reference voltage and the second reference voltage.

2. The precharge device of claim 1, wherein
the first reference voltage is a supply voltage, and
the second reference voltage is a ground potential.

3. The precharge device of claim 1, wherein
the common precharge voltage is substantially equal to an average of the first reference voltage and the second reference voltage.

4. The precharge device of claim 1, further including:
a controller that controls the operation of the first switch, the second switch, and the third switch so as to minimize a power requirement for the precharging of the data bus and the data-not bus.

5. The precharge device of claim 4, wherein
the first switch is further configured to couple the data bus to the second reference voltage,
the second switch is further configured to couple the data-not bus to the first reference voltage, and
the controller further controls the operation of the first switch and the second switch in dependence upon a prior state of at least one of the data bus and the data-not bus.

6. A memory device comprising:

a plurality of memory elements,
   each memory element having
      a first output corresponding to a stored logic value, and
      a second output corresponding to a complement of the stored logic value,
a selector that selects a select memory element of the plurality of memory elements,
a first data bus, operably coupled to the first output of the select memory element,
a second data bus, operably coupled to the second output of the select memory element, and
a precharge device, operably coupled to the first data bus and the second data bus, comprising:
   a first switch that couples the first data bus to a first reference voltage,
   a second switch that couples the second data bus to a second reference voltage that is different from the first reference voltage, and
   a third switch that couples the first data bus and the second data bus to produce a common precharge voltage on the first data bus and the second data bus that is a composite of the first reference voltage and the second reference voltage.

7. The memory device of claim 6, wherein
the first reference voltage is a supply voltage, and
the second reference voltage is a ground potential.

8. The memory device of claim 6, wherein
the common precharge voltage is substantially equal to an average of the first reference voltage and the second reference voltage.

9. The memory device of claim 6, further including:
a controller that controls the operation of the first switch, the second switch, and the third switch so as to minimize a power requirement for the precharging of the first data bus and the second data bus.

10. The memory device of claim 9, wherein
the first switch is further configured to couple the first data bus to the second reference voltage,
the second switch is further configured to couple the second data bus to the first reference voltage, and
the controller further controls the operation of the first switch and the second switch in dependence upon a prior state of at least one of the first data bus and the second data bus.

11. A method for enabling a precharge of a data bus and a data-not bus to facilitate a memory read operation, comprising:
enabling a connection of the data bus to a first reference voltage,
enabling a connection of the data-not bus to a second reference voltage,
enabling a connection of the data bus to the data-not bus to precharge the data bus and the data-not bus to a common precharge voltage that is a composite of the first reference voltage and the second reference voltage.

12. The method of claim 11, wherein
the first reference voltage is a supply voltage, and
the second reference voltage is a ground potential.

13. The method of claim 11, wherein
the common precharge voltage is substantially equal to an average of the first reference voltage and the second reference voltage.

14. The method of claim 11, further including:
enabling a connection of the data bus to the second reference voltage,
enabling a connection of the data-not bus to the first reference voltage, and
enabling a control of the connection of the data bus and the data-not bus to the first reference voltage and the second reference voltage in dependence upon a prior state of at least one of the data bus and the data-not bus.

* * * * *